United States Patent [19]

Goldrian

[11] Patent Number: 4,559,636
[45] Date of Patent: Dec. 17, 1985

[54] TIME-MEASURING ADAPTER FOR LOGIC ANALYZER

[75] Inventor: Gottfried Goldrian, Boeblingen, Fed. Rep. of Germany

[73] Assignee: International Business Machines Corporation, Armonk, N.Y.

[21] Appl. No.: 445,140

[22] Filed: Nov. 29, 1982

[30] Foreign Application Priority Data

May 24, 1982 [EP] European Pat. Off. ........ 82104508.5

[51] Int. Cl.[4] ............................................ G04F 10/00
[52] U.S. Cl. ..................................... 377/20; 324/73 R
[58] Field of Search ............... 364/900, 200, 550, 551, 364/579, 481, 488; 377/20, 39; 324/73 R, 133, 73 AT, 133

[56] References Cited

U.S. PATENT DOCUMENTS

| | | | |
|---|---|---|---|
| 4,008,389 | 2/1977 | Brunin et al. | 235/153 |
| 4,250,562 | 2/1981 | Haag et al. | 364/900 |
| 4,468,746 | 8/1984 | Davis | 377/20 |
| 4,484,329 | 11/1984 | Slamka et al. | 324/73 R |
| 4,523,289 | 6/1985 | Soma et al. | 377/20 |

OTHER PUBLICATIONS

Mar. 1981 Computer Design article, "Logic Analyzers Simplify System Integration Tasks", by P. Dittman, D. Glasby and C. Benenati, pp. 119-126.
Elektronic Article, vol. 27, No. 3, 1978, by M. V. Dolch, "Logikanalyse-Geratetechnik und Anwendungen", pp. 40-46, 65.
Sep. 1980 Electronic Engineering article, vol. 52, No. 642, London, "Logic Analysers", pp. 172-203.

*Primary Examiner*—John S. Heyman
*Assistant Examiner*—K. Ohralik
*Attorney, Agent, or Firm*—Carl M. Wright

[57] ABSTRACT

Logic analyzer adapter includes a time measuring adapter. Only a subset of the input channels of the signal analyzer are used to store input data when an event occurs, i.e., when one or more of the binary input signals change their value. A time counter is provided for measuring the time that has elapsed between two consecutive events. The contents of the time counter are transferred to the logic analyzer on the remaining input channels. In another mode of operation, the signal on a predetermined input channel is used to control the storing operation. The time counter is reset after each storing operation. In still another mode of operation, the signal on a predetermined channel can be used to inhibit or to allow the storing of the signals on the remaining input channels.

15 Claims, 5 Drawing Figures

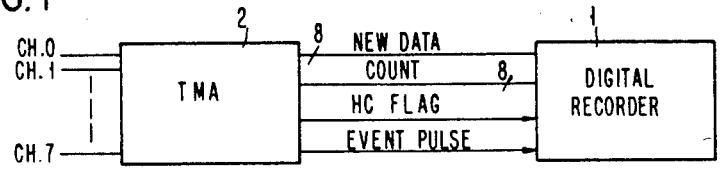
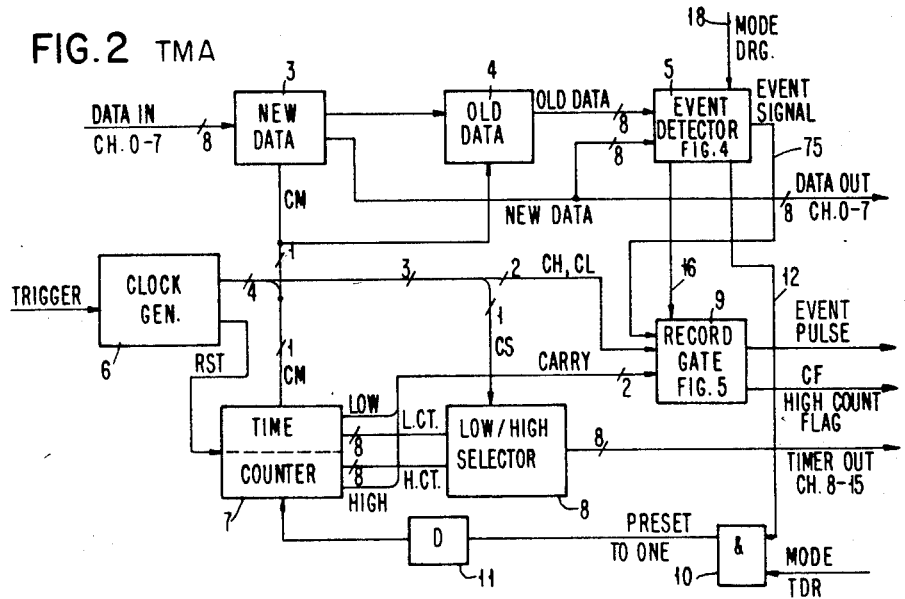
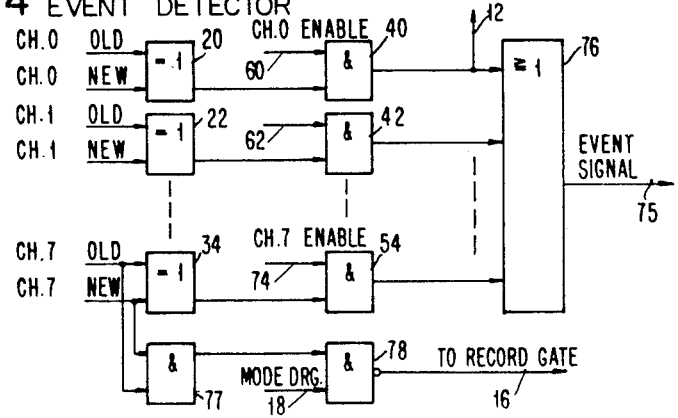

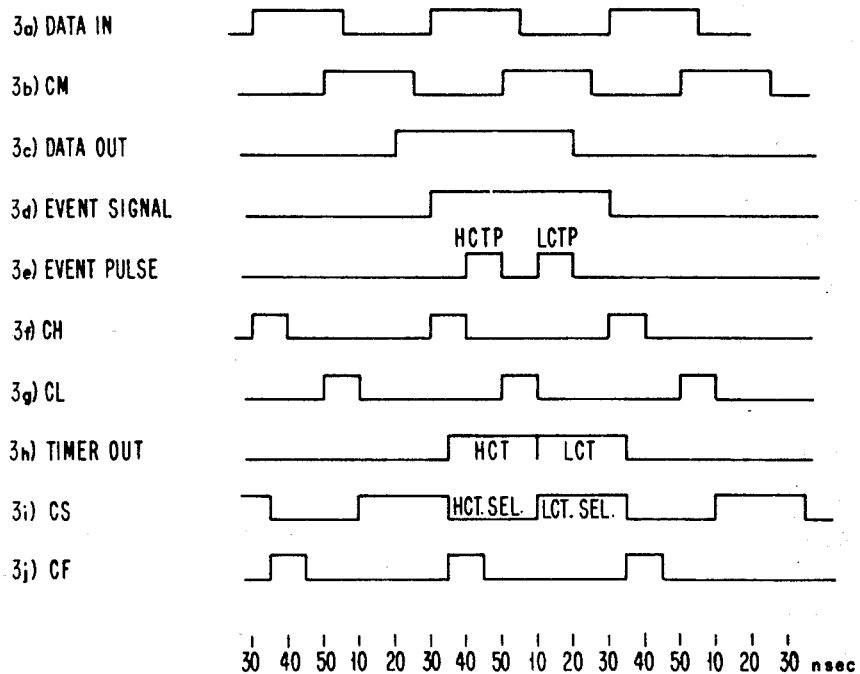
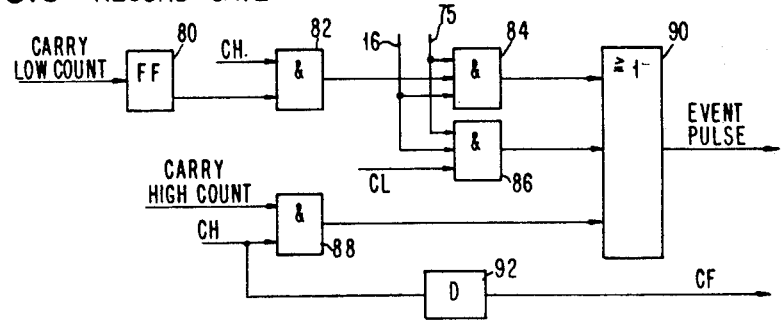

TIME-MEASURING ADAPTER FOR LOGIC ANALYZER

BACKGROUND OF THE INVENTION

Most logic analyzers include a digital recorder which can be used to record periodically and to analyze logic states of pulses in microprocessors or similar logic apparatus. (See, e.g., "Logic Analyzers Simplify System Integration Tasks," P. Dittman, D. Glasby, C. Benenati, *Computer Design*, Vol. 20, No. 3, March 1981, pp. 119-126.)

Such analyzers are also very useful in the development of mechanical engines, such as printers, in that they permit recording and analyzing data on the movement of mechanical parts. Examples of such use are in the analyses of acceleration and deceleration phases of digitally controlled stepper motors in belt printers. For recording the most important electrical control signals during these phases, a record time of about 100 msec and a sampling period of 100 nsec on eight input channels would be required. Unfortunately, the storage capacity of such logic analyzers is generally very limited, amounting, for example, to one thousand bits for each input channel. However, the above-mentioned example would require a storage capacity of one million bits for each channel.

SUMMARY OF THE INVENTION

The invention as claimed is intended to remedy these drawbacks.

It is therefore an object of the present invention to use the capacity of logic analyzer storages more economically.

A more specific object of the invention is to provide a time-measuring adapter saving storage capacity by storing time counts.

A time-measuring adapter according to the present invention is exemplified by a time counter advanced by an internal clock of the logic analyzer, whose time counts are transferred to the storage of the analyzer when an event occurs, i.e., when one or more of the binary input signals change their binary value on some of the input channels.

In a more specific version, the time counter comprises a low part storing the less significant bits and a high part storing the more significant bits. If there is a change only in the low count between two consecutive events, then only the low part needs to be transmitted to the recorder. If there is also a change in the high part, a separate storage cycle is initiated in the recorder for each storage. When the time counter overflows, the maximum count is transferred to the recorder irrespective of the occurrence of an event.

A recording operation in the recorder is triggered by an event pulse generated by a record gate controlled by an event signal and suitable clock pulses. The event signal is generated by an event detector comparing input data at two consecutive sampling times.

Several modes of operation are possible for the time measuring adapter:

1. Normal Time Recording mode. The time counter is continuously advanced by clock pulses. In most cases, only the low count needs to be transferred to the recorder in response to an event. High counts and counter overflows are only transferred if necessary.

2. Time Difference Recording mode. An event on a specified channel presets the time counter after its counter contents have been recorded. This mode permits measuring the ON and OFF times of pulses recorded on this specified channel.

3. Dynamic Recording Gate mode. The recording operation takes place only if the binary signal on a predetermined channel is not one. This mode allows recording data only at interesting times of relatively long processes. The recordings of the above-mentioned acceleration and deceleration periods of a high-speed stepper motor are examples of the use of this mode.

The advantages offered by the invention mainly lead to the storage capacity of the recorder being used more economically. The invention avoids recording data which change only slowly or not at all. Instead, the time elapsing between two consecutive events is recorded. Although only some of the input channels, for instance, eight of 16, can be used to store data, because the remaining eight channels are used to store time counts, the overall recording efficiency is improved. This permits analyzing the complete movement phase of a stepper motor, which is generally not possible because of the limited storage capacity of most logic analyzers.

The Time Difference Recording mode is particularly useful if the signal on one predetermined input channel has to be analyzed more thoroughly.

The Dynamic Recording Gate mode is particularly useful for recording processes that show little or no activity over long periods and much activity over relatively short ones.

One way of carrying out the invention is described in detail below with reference to the figures of the drawing.

DESCRIPTION OF THE DRAWING

FIG. 1 is a simplified block diagram of a digital recorder and a time measuring adapter illustrating the present invention.

FIG. 2 is a more detailed block diagram of the time measuring adapter shown in FIG. 1.

FIG. 3 is a timing diagram of the operation of the time measuring adapter.

FIG. 4 is a circuit diagram of the event detector shown in FIG. 2.

FIG. 5 is a circuit diagram of the record gate shown in FIG. 2.

DETAILED DESCRIPTION

FIG. 1 shows eight input channels, CH0 to CH7, connected to a digital recorder 1 by a time measuring adapter TMA 2. Digital recorder 1 may be part of a logic analyzer which may include, if necessary, other functional units, such as an oscilloscope permitting visual analysis. Channels 0 to 7 may be independent binary channels or be used in combination for the binary-coded representation of an analog signal.

Channels 0 to 7 are sampled by a clock of TMA 2. If one or more bits of the 8-bit input data differ at two consecutive sampling instants, the new 8-bit data are transmitted to the digital recorder 1. TMA 2 generates an event-pulse, triggering the internal recording of the new data in recorder 1.

According to the invention, TMA 2 includes a timing counter for measuring time intervals between consecutive events, such an event signifying polarity changes of one or more bits on the input channels. Together with the new data, the timing count of the counter is also stored in the digital recorder. If the timing counter in TMA 2 comprises a high-count part and a low-count part, a high-count (HC) flag may be transmitted to digital recorder 1 if the 8-bit count relates to the high part. If the digital recorder 1 comprises only 16 input channels and one additional control input for triggering the internal clock of the digital recorder for initiating storage of data on the 16 input channels, the HC flag may be transmitted over one of the eight data input channels. This, of course, leads to the loss of one input data bit so that only seven input data bits can be stored in the digital recorder. Alternatively, consecutive storage of two counts together with the same data bits is interpreted as initially storing a high count and then storing a low count.

The time measuring adapter 2 will be described in detail below with reference to FIG. 2.

The time measuring adapter TMA 2 solves the problem of the limited storage capacity of the digital recorder by employing half (0-7) of the input channels of the recorder for storing data signals and the other half (8-15) for storing a time count for each polarity change (event) of an input signal. Other partitions of the recorder's input channels are possible; the described use of two disjoint subsets of eight channels each is for purposes of illustrating the preferred embodiment of the invention. Thus, rather than storing every input data sample, the eight-bit input data byte is stored only if one or more input signals change their polarity. As a result, an eight-bit time count is stored which represents the time that has elapsed between consecutive events. Data signals on the first half of the analyzer input channels (0-7) are stored as new data in register 3. During the subsequent sampling period, the contents of register 3 are transferred to register 4, thus becoming the old data. The old and the new data are compared in event detector 5 which issues an event signal if one or more data bits are not equal.

TMA 2 receives an accurate reference frequency, preferably from the time base of the digital recorder. Clock generator 6 generates six timing signals which will be described in detail with reference to FIG. 3. One of the timing signals is a main clock signal CM. This signal sets data latches in registers 3 and 4 and increments a 16-bit time counter 7 which should operate synchronously to permit reliable time measurements and which can be reset by RST signal from clock generator 6. As with an eight-bit data byte, only the eight low-order bits of counter 7 can be stored if an event occurs, i.e., if one or more of the data bits change their polarity, the eight high-order bits of the counter have to be stored in a separate storage cycle of the recorder. A low/high selector 8 correspondingly selects either the eight-bit low or the eight-bit high count for output on an 8-bit timer-out-bus. A high-count flag CF, generated by record gate 9, indicates transmission of a high count.

Record gate 9 generally controls the recording operations and will be described in greater detail with reference to FIG. 5.

It transfers an event pulse to recorder 1, triggering a recording operation therein.

Clock generator 6 also generates a selector clock pulse CS for controlling selector 8, and two clock pulses CH, CL for recording high or low counts. Record gate 9 also receives two carry signals indicating low- or high-count carries.

Operation of TMA 2 will be described below by means of the timing diagram of FIG. 3. At a 20 MHz repetition rate of clock generator 6, the duration of one TMA cycle is 50 nanoseconds. Line (a) of FIG. 3 shows that new data are stored into register 3 every 50 nsec. Main clock pulse CM, shown in line (b), serves to transfer data bytes in registers 3 and 4 and to increment time counter 7.

The data byte stored in new data register 3 is available on the output bus to the recorder 1 for the whole cycle, as shown in line (c). The event signal generated by event detector 5 is also available for the whole cycle, as shown in line (d).

As shown in line (e), the event pulse generated by record gate 9 consists of a high-count part HCTP and a low-count part LCTP. If the high-count part of counter 7 is not zero and has changed in two consecutive sampling periods, the high-count part of counter 7 is initially transferred first through selector 8 to the timer-out-bus. Then, the low-count part of counter 7 is transferred. For timing the transfer of time counts to recorder 1, clock generator 6 generates a high-count clock CH and a low-count clock CL shown in lines (f) and (g). In both cases, storage of a time count is initiated in recorder 1 by an event pulse transmitted to the recorder. There are two ways of distinguishing between storing a high- or a low-count in recorder 1:

1. As the storage of a high-count (triggered by a HCT event pulse) and the subsequent storage of a low-count (triggered by a LCT event pulse) are both accompanied by storage of the same data byte on the new data bus, this equality of stored data in the same 50 nsec sampling period can be used to define the first stored count as high count and the second stored count as low count.

2. A separate high-count flag CF as shown in line (j) of FIG. 3 may be used to distinguish between storage of a high count and the storage of a low count in recorder 1. As generally there is no additional input channel to recorder 1, one of the data bit input channels has to be used to transmit flag CF to recorder 1.

Line (h) shows the availability of time counts on the timer out bus.

Line (i) shows the selector clock CS as a free-running clock alternately selecting low- and high-part transmission gates of selector 8.

Three modes of operation of time measuring adapter 2, shown in FIG. 2, will be described below.

1. Normal Time Recording (NTR) mode

All data and control latches and counter 7 are reset. Counter 7 starts counting when a trigger input pulse is applied to clock generator 6. This pulse may originate from the data channels or a trigger output of the digital recorder.

Each time an input signal changes its polarity on the connected data channels 0 to 7, an event pulse is emitted, causing the contents of register 3 and the counter 7 to be stored in the digital recorder. Either one or two record cycles are performed. One cycle is performed if there has been no carry from the lower half of the counter for two events. If a carry occurs, the higher half of counter 7 is also recorded.

2. Time Difference Recording (TDR) mode

A key is provided in TMA 2 which, when switched on, causes every event on a defined channel, for example, channel 0, to preset counter 7 to one after the contents of the counter have been recorded. This mode permits measuring the ON and OFF times of pulses received on channel 0. (The counter is not reset to zero but preset to one because some time is needed for presetting and a counting pulse would otherwise be lost.)

3. Dynamic Recording Gate (DRG) mode

When the respective key in TMA 2 is switched on, a positive change of the signal on a defined channel, for example, channel 7, disables the recording of all subsequent events on the remaining channels 0 to 6. Only the overflow of counter 7 is recorded. If the signal on channel 7 changes back to minus, this event and all subsequent events are again recorded. This mode permits recording data only at interesting times of relatively long processes, such as the acceleration and deceleration times of a high-speed stepper motor.

In the NTR or the DRG mode, counter 7 may be reset at the start of the recording operation, thus storing accumulated time counts. Each event causes the absolute time of its occurrence to be recorded. Using a 16-bit counter and a 20 MHz clock, a time period of up to 3.28 msec can be processed without a counter overflow.

Alternatively, counter 7 can be reset by each event signal, recording only relative counts of the time elapsing between two consecutive events. With an eight-bit counter low part, relative time intervals of up to 12.8 microseconds can be processed without having to use a two-part recording cycle for also storing the high count of counter 7.

As shown in FIG. 2, a time difference recording mode signal TDR is shown as one input to AND-gate 10. The other input is a signal resulting from the comparison of old and new data bits for channel 0 in event detector 5, as will be shown later with respect to FIG. 4. In the TDR mode, time counter 7 is preset to one by the event pulse 12 (suitably delayed by delay 11) for channel 0.

A dynamic recording gate mode signal DRG is supplied to event detector 5 on line 18 as will be shown later with respect to FIG. 4. In the DRG mode, a signal on line 16 controls the record gate 9, as will be shown later with respect to FIG. 5.

In FIG. 4, event detector 5 comprises a series of eight XOR-gates 20 to 34, and a series of eight AND-gates 40 to 54, one each for the eight channels 0 to 7. Each XOR-gate compares the old and new data bit for the respective channel and delivers an output signal to the respective AND-gate. AND-gates 40 to 54 are controlled at their second input by enabling signals 60 to 74. These enabling signals permit controlling the generation of the event signal on line 75 by OR-gate 76 such that one or more channels can be excluded from the comparison. Where no enabling signal is applied to one or more of the AND-gates 40 to 54, no output signal of such an AND-gate is applied to OR-gate 76 for generating an event signal.

Also shown in FIG. 4 is the generation of a signal on line 12 which presets counter 7 to 1. This signal is generated by the output signal of XOR 20, comparing the old and the new bit of channel 0.

Shown further in FIG. 4 is an AND-gate 77 delivering a signal to NAND-gate 78 when both the old and the new bit of channel 7 are one. A dynamic recording gate mode signal DRG is supplied to the second input of NAND-gate 78 on line 18. The output signal of NAND-gate 78 is one, except when mode signal DRG is supplied and both the old and new bits of channel 7 are one.

The signal on line 16 is supplied to record gate 9 which will now be described below with reference to FIG. 5. The event pulse, triggering a storage operation in digital recorder 1, is generated by OR-gate 90 if one of three conditions is fulfilled:

(1) Assuming that TMA 2 is not working in the DRG mode, the signal on line 16 is always one. Therefore, AND-gate 86 generates an event pulse through OR-gate 90, if an event signal 75 has been generated by event detector 5 and low-count clock signal CL (g, FIG. 3) is high. The low count of time counter 7 is recorded in recorder 1.

(2) If the high count is not zero and has been changed in the last sampling period, a low-count carry signal is transmitted from time counter 7 to record gate 9, setting a low-count carry latch 80 in record gate 9. AND-gate 82 delivers an output signal to AND-gate 84 when high-count clock pulse CH (f, FIG. 3) is applied. AND-gate 84 generates a signal, thus permitting the high-count part of time counter 7 to be transmitted. It is seen that neither AND-gate 84 nor AND-gate 86 generates an output signal if TMA 2 functions in the dynamic recording gate mode and both the old and the new bit of channel 7 are one, because the signal on line 16 is zero.

(3) An overflow of time counter 7 must be recorded in recorder 1 irrespective of the generation of an event signal. AND-gate 88 is provided for that purpose, generating an output signal if clock pulse CH is high and a carry signal from the high count part of counter 7 is applied to AND-gate 88. This carry pulse generates an artificial event pulse which permits recording the maximum count of counter 7 in recorder 1.

A high-count flag pulse CF may be transmitted to recorder 1 on one of the data input channels to permit distinguishing in recorder 1 between storage of a high count and storage of a low count. Flag pulse CF is generated from high-count pulse CH by a suitable delay 92.

In the DRG mode, event pulses are generated by event signals 75 by AND-gates 84 or 86 if signal 16 is one, i.e., if at least one of the old and new channel 7 data bit is zero.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for using a digital device of the type having a plurality of input channel means and storing, in response to a control signal, values of signals applied to said input channel means, comprising the steps of:
   coupling a selected subset of said plurality of input channel means to sources of event signals;
   applying, to the remaining subset of input channel means, a plurality of signals representative of elapsed time between two consecutive changes of values of an event; and
   generating said control signal to store the values applied to said input channel means when any event changes its value.

2. The invention as claimed in claim 1 including the step of accumulating the elapsed time between successive timing signals.

3. The invention as claimed in claim 1 including the step of restarting the elapsed time at each timing signal.

4. The invention as claimed in claim 1 including the step of controlling said generating of the control signal according to the value of the signal on a predetermined one of said selected subset of said plurality of input channel means.

5. Time measuring adapter apparatus for use with a digital device of the type having a plurality of input channel means for storing, in response to a control signal, the signals applied to said input channel means, comprising, in combination:
event detector means responsive to said plurality of input channel means for generating said control signal upon the change of a signal applied to any one of a first subset of said plurality of input channel means;
means for generating clock signals;
counter means coupled to said clock signal generating means for counting said clock signals and for supplying count values representative of a count value in said counter means; and
means for coupling the count values to a second subset of said plurality of input channels.

6. The invention as claimed in claim 5 wherein said event detector means comprises:
means for comparing the values of said event signals at two consecutive sampling intervals; and
means responsive to said comparing means for supplying said control signal.

7. The invention as claimed in claim 6 including:
means for supplying an enabling signal to said control signal supplying means.

8. The invention as claimed in claim 7 wherein said enabling signal supplying means includes:
gating means responsive to the event signals at two consecutive sampling intervals from a selected one of said first subset of the plurality of input channel means for supplying said enabling signal.

9. The invention as claimed in claim 5 wherein said counter means comprises:
low count means responsive to said clock signals for storing a low-count value in a number of binary stages not greater than the number of input channels in said second subset of the plurality of input channels and for providing a carry-out signal when said low-count value exceeds its capacity; and
high count means, responsive to said carry-out signal, for storing a high-count value in a number of binary stages not greater than the number of input channels in said second subset of the plurality of input channels.

10. The invention as claimed in claim 9 further including:
carry means in said clock signal generating means for supplying a selector signal upon the occurrence of every n-th clock signal; and
selector means responsive to said selector signal for alternatively coupling said high-count value and low-count value to said second subset of the plurality of input channels.

11. The invention as claimed in claim 9 wherein said event detector means includes means responsive to a signal from the clock signal generating means for generating a control signal to store said low-count value.

12. The invention as claimed in claim 10 wherein said event detector means includes means responsive to a signal from said clocking means for generating a control signal to store said high-count value.

13. The invention as claimed in claim 5 wherein said counter means includes reset means for initializing said counter to a reference value in response to a reset signal; and
means for generating a reset signal in response to a control signal.

14. The invention as claimed in claim 13 wherein said reset signal generating means includes a means for delaying said reset signal.

15. The invention as claimed in claim 14 wherein said reset signal generating means includes means for inhibiting said reset signal in the absence of a gating signal.

* * * * *